(12) United States Patent
Hou

(10) Patent No.: US 11,495,779 B2
(45) Date of Patent: Nov. 8, 2022

(54) PIXEL DEFINING LAYER AND MANUFACTURING METHOD THEREOF, ARRAY SUBSTRATE AND DISPLAY DEVICE

(71) Applicant: BOE Technology Group Co., Ltd., Beijing (CN)

(72) Inventor: Wenjun Hou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 361 days.

(21) Appl. No.: 16/713,295

(22) Filed: Dec. 13, 2019

(65) Prior Publication Data

US 2020/0212371 A1 Jul. 2, 2020

(30) Foreign Application Priority Data

Jan. 2, 2019 (CN) .......................... 201910002338.3

(51) Int. Cl.
*H01L 27/32* (2006.01)
*H01L 51/56* (2006.01)
*H01L 51/00* (2006.01)

(52) U.S. Cl.
CPC ............ *H01L 51/56* (2013.01); *H01L 27/326* (2013.01); *H01L 51/003* (2013.01); *H01L 51/0005* (2013.01); *H01L 51/0007* (2013.01); *H01L 51/0017* (2013.01)

(58) Field of Classification Search
CPC .............................. H01L 27/326; H01L 51/56
See application file for complete search history.

(56) References Cited

U.S. PATENT DOCUMENTS

| | | | | |
|---|---|---|---|---|
| 2007/0176545 | A1* | 8/2007 | Kanoh | ................ H01L 27/3246 428/917 |
| 2011/0101317 | A1 | 5/2011 | Gregory et al. | |
| 2013/0119413 | A1* | 5/2013 | Harada | ............... H01L 51/5048 438/46 |

(Continued)

FOREIGN PATENT DOCUMENTS

| | | |
|---|---|---|
| CN | 102017158 A | 4/2011 |
| CN | 104393192 A | 3/2015 |

(Continued)

OTHER PUBLICATIONS

First office action of Chinese application No. 201910002338.3 dated Mar. 23, 2020.

*Primary Examiner* — Douglas M Menz
(74) *Attorney, Agent, or Firm* — Fay Sharpe LLP

(57) ABSTRACT

The present disclosure discloses a pixel defining layer and a manufacturing method thereof, an array substrate and a display device, and belongs to the field of display technology. The pixel defining layer includes a plurality of pixel defining structures arranged in an array, wherein the pixel defining structure includes a first bottom surface and a second bottom surface opposite each other, and a side surface located between the first bottom surface and the second bottom surface. Since the side surface is non-planar, the structure between the side surface and the bottom surface close to the base substrate constitutes a capillary structure. During the inkjet printing process, the solution in which the organic light emitting material is dissolved can spread more evenly under the attraction of the capillary structure.

19 Claims, 14 Drawing Sheets

(56) References Cited

U.S. PATENT DOCUMENTS

| | | | |
|---|---|---|---|
| 2016/0056218 A1* | 2/2016 | Wang | H01L 27/3246 438/34 |
| 2016/0111688 A1* | 4/2016 | Lee | H01L 51/0007 438/34 |
| 2016/0133676 A1* | 5/2016 | Kim | H01L 27/3246 438/35 |
| 2016/0254331 A1* | 9/2016 | Wang | H01L 27/3246 257/40 |
| 2016/0351635 A1 | 12/2016 | Li | |
| 2016/0358987 A1* | 12/2016 | Hou | H01L 51/52 |
| 2017/0125719 A1* | 5/2017 | Noh | H01L 27/3211 |

FOREIGN PATENT DOCUMENTS

| | | |
|---|---|---|
| CN | 108281467 A | 7/2018 |
| CN | 108987442 A | 12/2018 |

* cited by examiner

601

Forming a pixel defining layer on a base substrate, wherein the pixel defining layer includes a plurality of pixel defining structures, wherein the pixel defining structure has a first bottom surface and a second bottom surface opposite each other, and a side surface between the first bottom surface and the second bottom surface, the side surface is non-planar

FIG. 8

PIXEL DEFINING LAYER AND MANUFACTURING METHOD THEREOF, ARRAY SUBSTRATE AND DISPLAY DEVICE

The present disclosure claims priority to Chinese Patent Application No. 201910002338.3, filed on Jan. 2, 2019 and titled "Pixel Defining Layer and Manufacturing Method Thereof, Self-Luminous Display Panel and Display Device", which is incorporated herein by reference in its entirety.

TECHNICAL FIELD

The present disclosure relates to the field of display technology, and in particular, to a pixel defining layer and a manufacturing method thereof, an array substrate and a display device.

BACKGROUND

The self-luminous display panel has the advantages of fast response, wide viewing angle, high brightness, bright color, lightness and thinness, etc., and generally includes a pixel defining layer and a plurality of sub-pixels arranged in an array.

The pixel defining layer includes a plurality of pixel defining structures, and defines a plurality of sub-pixel regions arranged in an array on a base substrate by the plurality of pixel defining structures, wherein the plurality of sub-pixel regions are used to form a plurality of sub-pixels.

SUMMARY

The present disclosure provides a pixel defining layer and a manufacturing method thereof, an array substrate and a display device. The technical solution is as follows:

According to a first aspect of the present disclosure, a pixel defining layer is provided. The pixel defining layer includes: a plurality of pixel defining structures arranged in an array, the pixel defining structure having a first bottom surface and a second bottom surface opposite each other and a side surface located between the first bottom surface and the second bottom surface, the side surface being non-planar.

Optionally, the side surface is a convex surface.

Optionally, the side surface includes a first region close to the first bottom surface, and a second region close to the second bottom surface.

The slope of any position in the first region relative to an abscissa axis is greater than zero, the slope of any position in the second region relative to the abscissa axis is less than zero, and the abscissa axis is parallel to a setting surface of the pixel defining layer.

The distance between a boundary line of the first region and the second region and the setting surface ranges from 0.3 micron to 0.6 micron.

Optionally, the side surface is a cambered surface.

Optionally, an inclination angle is between a target cut surface of the side surface and the first bottom surface, wherein the target cut surface is a cut surface of the side surface at a boundary with the first bottom surface, the inclination angle ranging from 30 degrees to 60 degrees.

Optionally, the pixel defining structure comprises a lyophobic material layer repelling liquid.

Optionally, the pixel defining structure further comprises: a lyophilic material layer between a setting surface of the pixel defining layer and the lyophobic material layer, the lyophilic material layer attracting liquid.

Optionally, the lyophilic material layer has a thickness of 0.3 micron.

Optionally, the distance between the first bottom surface and the second bottom surface ranges from 0.5 micron to 3 microns.

Optionally, the side surface is a cambered surface, an inclination angle is between the target cut surface of the side surface and the first bottom surface, wherein the target cut surface is a cut surface of the side surface at a boundary with the first bottom surface, the inclination angle ranges from 30 degrees to 60 degrees, and the distance between the first bottom surface and the second bottom surface ranges from 0.5 micron to 3 microns;

the pixel defining structure satisfies any one of the following conditions:

the pixel defining structure comprises a lyophobic material layer;

the pixel defining structure comprises: a lyophilic material layer and a lyophobic material layer, and the lyophilic material layer is located between the setting surface of the pixel defining layer and the lyophobic material layer;

wherein the lyophilic material layer attracts liquid, and the lyophobic material layer repels liquid; the lyophilic material layer has a thickness of 0.3 micron.

According to a second aspect of the present disclosure, a method of manufacturing a pixel defining layer is provided. The method comprises:

forming a pixel defining layer on a base substrate, the pixel defining layer comprising a plurality of pixel defining structures arranged in an array;

wherein the pixel defining structure has a first bottom surface and a second bottom surface opposite each other, and a side surface located between the first bottom surface and the second bottom surface, the side surface being non-planar.

Optionally, forming a pixel defining layer on a base substrate comprises:

forming a first pattern layer on the base substrate, the first pattern layer having at least one hollow;

filling the hollow of the first pattern layer with a pixel defining material;

removing the first pattern layer after curing the pixel defining material, to obtain the pixel defining layer on the base substrate.

Optionally, forming a first pattern layer on the base substrate comprises:

forming a first pattern material layer on the base substrate;

forming a photoresist layer on the first pattern material layer;

exposing and developing the photoresist layer to obtain a photoresist pattern;

etching, by a wet etching process, the first pattern material layer formed with the photoresist pattern;

peeling off the photoresist pattern to obtain the first pattern layer.

Optionally, the first pattern material layer comprises a metal layer.

Optionally, the material of the metal layer comprises aluminum, and etching, by a wet etching process, the first pattern material layer formed with the photoresist pattern, comprises:

etching the first pattern material layer formed with the photoresist pattern for 20 seconds to 50 seconds by using hydrochloric acid having a concentration ranging from 0.1% to 5% at a temperature ranging from 30 degrees to 60 degrees.

Optionally, the pixel defining material comprises a lyophobic material repelling liquid.

Optionally, the pixel defining material comprises a lyophobic material and a lyophilic material, and filling the hollow of the first pattern layer with a pixel defining material comprises:

filling the hollow of the first pattern layer with a lyophilic material, and curing the lyophilic material to obtain a lyophilic material layer;

filling the hollow of the first pattern layer formed with the lyophilic material layer with the lyophobic material, and curing the lyophobic material to obtain a lyophobic material layer;

the lyophilic material attracting liquid, and the lyophobic material repelling liquid.

Optionally, the pixel defining material satisfies any one of the following conditions:

the pixel defining material comprises a lyophobic material;

the pixel defining material comprises a lyophobic material and a lyophilic material, and filling the hollow of the first pattern layer with the pixel defining material comprises: filling the hollow of the first pattern layer with a lyophilic material, and curing the lyophilic material to obtain a lyophilic material layer; filling the hollow of the first pattern layer formed with the lyophilic material layer with the lyophobic material, and curing the lyophobic material to obtain a lyophobic material layer;

wherein the lyophilic material attracts liquid, and the lyophobic material repels liquid.

According to a third aspect of the present disclosure, an array substrate is provided. The pixel defining layer in the array substrate comprises: a plurality of pixel defining structures arranged in an array;

the pixel defining structure has a first bottom surface and a second bottom surface opposite each other, and a side surface located between the first bottom surface and the second bottom surface, the side surface being non-planar.

According to a fourth aspect of the present disclosure, a display device is provided. The display device comprises the array substrate of the third aspect.

BRIEF DESCRIPTION OF THE DRAWINGS

FIG. 8 is a flowchart of a method for manufacturing a pixel defining layer according to an embodiment of the present disclosure;

DETAILED DESCRIPTION

To present the principles, technical solutions, and advantages of the present disclosure more clearly, the present disclosure will be described in further detail with the accompanying drawings.

Relative to a Liquid Crystal Display (LCD), the self-luminous display panel has the advantages of self-luminance, fast response, wide viewing angle, high brightness, bright color, lightness and thinness, etc. The self-luminous display panel may be an Organic Light Emitting Diode (OLED) or a Quantum Dot Light Emitting Diode (QLED).

The methods of manufacturing the organic light emitting layer in the self-luminous display panel may include vacuum evaporation and solution process. The solution process may include spin coating technology, inkjet printing technology and nozzle coating technology, etc., and is suitable for film formation of polymer materials and small molecules that are soluble. The device for solution process is low in cost and has great advantages in large-scale and large-size production, especially, when the inkjet printing technology is used, the film layer preparation efficiency is high.

Each of the sub-pixels in the self-luminous display panel includes superposed first electrodes, organic light-emitting layers, second electrodes, and generally the first electrode is an anode and the second electrode is a cathode. The organic light-emitting layer may be manufactured by using the said inkjet printing technology. When an organic light-emitting layer is manufactured by using the inkjet printing technology, it is necessary to form a pixel defining layer on the base substrate first, and then spray a solution in which the organic light-emitting material is dissolved onto the base substrate formed with the pixel defining layer, to form an organic light emitting layer within each sub-pixel region, and the evenness of thickness of the organic light emitting layer directly affects the evenness of luminance of the self-luminous display panel.

Figure 1:
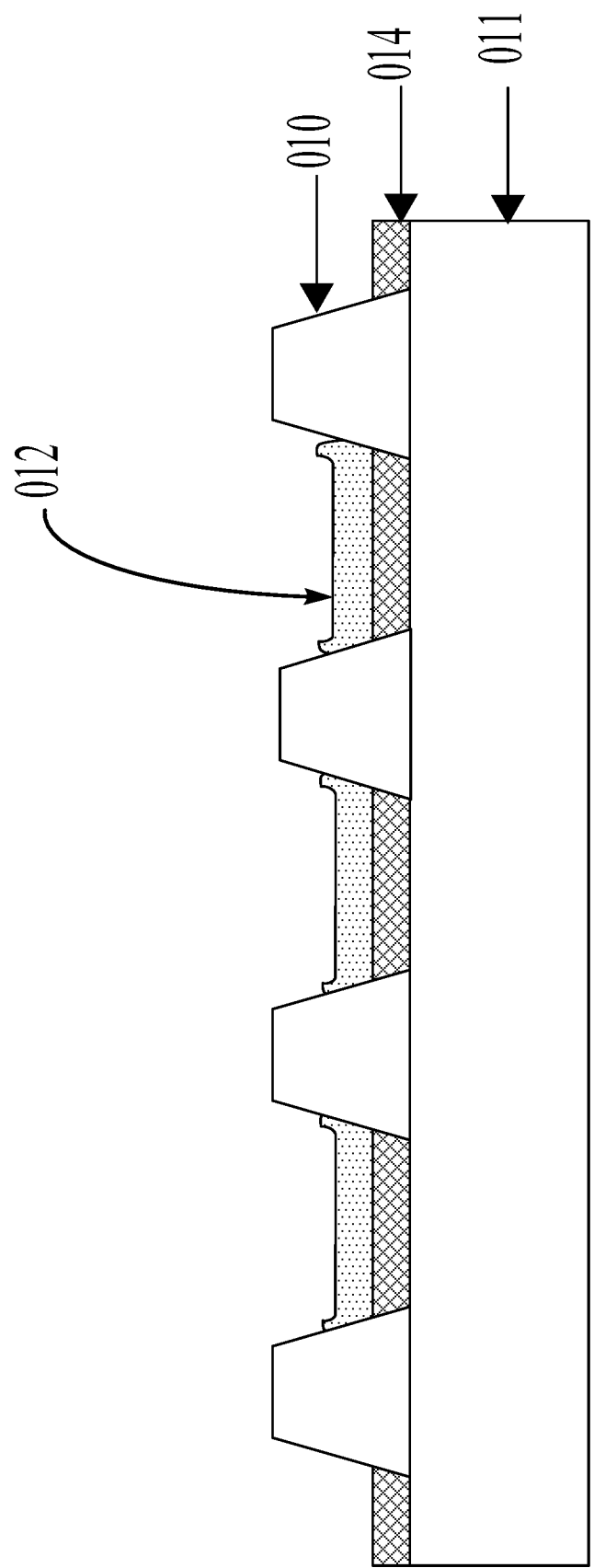
FIG. 1 is a schematic structural diagram of a pixel defining layer in the related art.

The pixel defining layer in the related art is generally made of a negative photoresist having lyophobic property, and a pixel defining layer may be formed by patterning a negative photoresist layer formed on the base substrate. The pixel defining layer includes a plurality of pixel defining structures, and the cross section of the surface where the pixel defining structure is perpendicular to the base substrate is a trapezoid. FIG. 1 shows a pixel defining layer in the related art, what is included is the cross section of the surface where a pixel defining structure 010 is perpendicular to the base substrate 011 may be a "rightly-placed" trapezoid, and it is assumed in FIG. 1 that the organic light-emitting layer 012 is formed above the anode 014. Since the surface performance of the material of the pixel defining structure 010 has a great difference from that of the solution in which an organic light emitting material is dissolved, a coffee ring effect may easily occur for the organic light emitting layer 012 that is formed after inkjet printing. The organic light-emitting layer 012 with a coffee ring effect is an uneven film having a thick edge and a thin middle, which affects the evenness of the luminance of the self-luminous display panel, thereby affecting the display performance of the self-luminous display panel.

Figure 2:
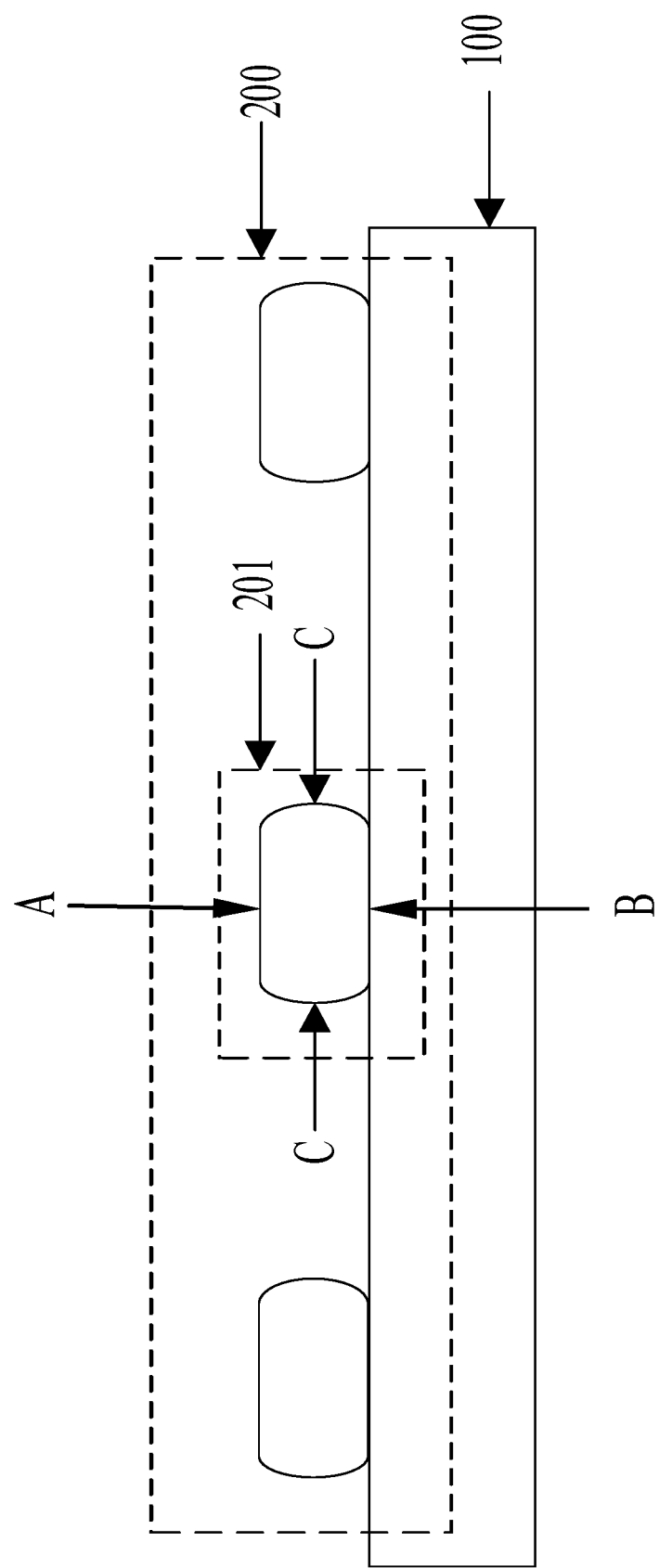
FIG. 2 is a schematic structural diagram of a pixel defining layer according to an embodiment of the present disclosure.

The present disclosure provides a pixel defining layer 200 that can solve the problems in the related art. As shown in FIG. 2, the pixel defining layer 200 includes a plurality of pixel defining structures 201 arranged in an array.

The pixel defining structure 201 has a first bottom surface A and a second bottom surface B opposite each other, and a side surface C located between the first bottom surface A and the second bottom surface B, the side surface C being non-planar.

Illustratively, the side surface C may be a convex surface, and in FIG. 2, it is illustrated by an example that the side surface C is convex with respect to the edge of the first bottom surface A and the edge of the second bottom surface B. Of course, the side surface C may also be a concave surface, and at this time, the side surface C may be concave with respect to the edge of the first bottom surface A and the edge of the second bottom surface B. Or, the side surface C may be a wave surface or the like.

In the first bottom surface A and the second bottom surface B, the first bottom surface A may be away from the base substrate 100, and the second bottom surface B is close to the base substrate 100. The pixel defining layer is generally disposed on the base substrate. FIG. 2 schematically depicts three pixel defining structures 201 disposed on the base substrate 100. Of course, the embodiment of the present disclosure does not limit the number of pixel defining structures 201 included in the pixel defining layer 200. In actual implementation of the embodiment of the present disclosure, the number of pixel defining structures 201 is determined by the resolution or pixel density of the self-luminous display panel. Generally, the number defining the pixel of structures 201 is hundred(s) or thousand(s).

In summary, as to the pixel defining layer provided by the embodiment of the present disclosure, since the side surface of the pixel defining structure included in the pixel defining layer is convex with respect to the edge of the first bottom surface and the edge of the second bottom surface of the pixel defining structure, the structure between the side surface and the bottom surface close to the base substrate constitutes a capillary structure; during the inkjet printing process, the solution in which the organic light emitting material is dissolved can spread more evenly under the attraction of the capillary structure; compared with the existing technology, this effectively reduces the climbing degree of the solution on the pixel defining layer, thereby effectively improving the evenness of film formation of the solution within the pixel region and the display performance of the self-luminous display panel.

Figure 3:
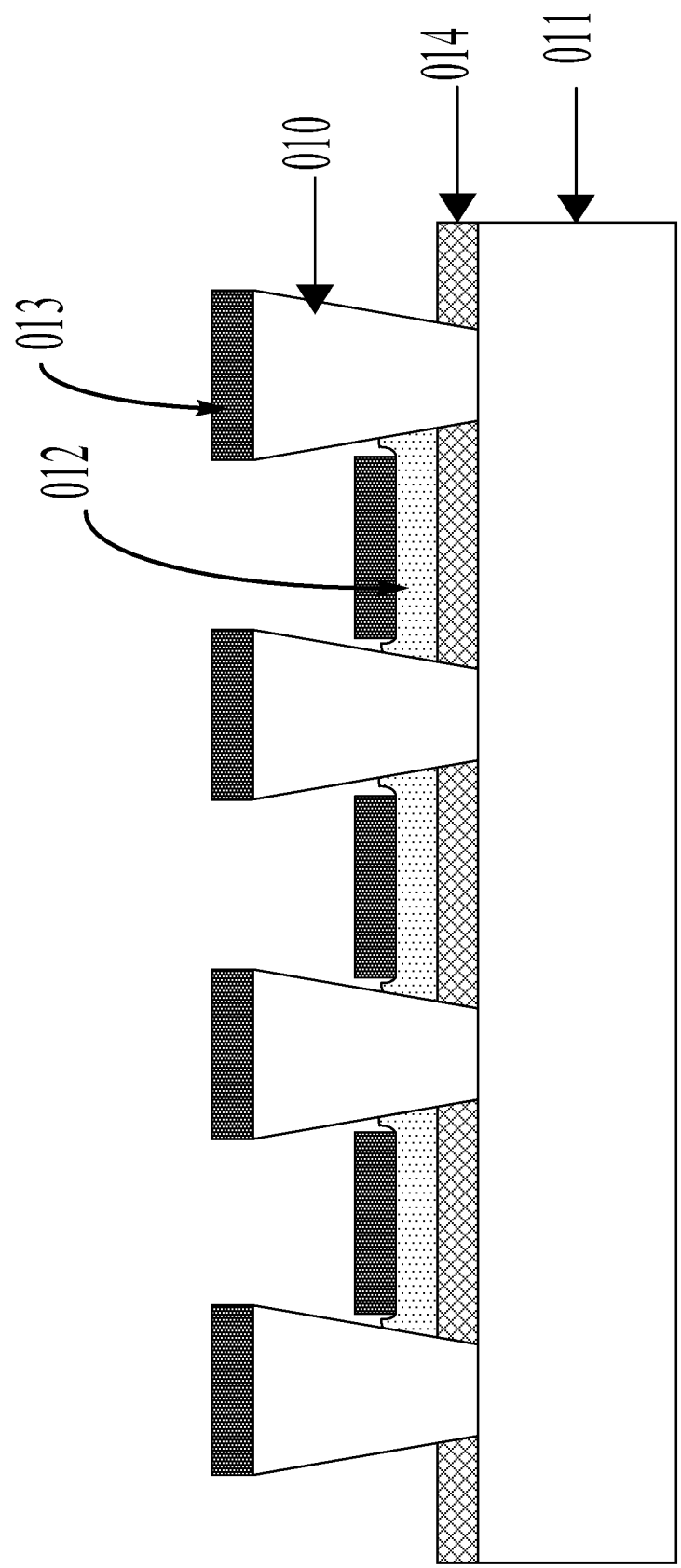
FIG. 3 is a schematic structural diagram of another pixel defining layer in the related art.

Another pixel defining layer is also provided in the related art. The pixel defining layer can include a plurality of pixel defining structures 010 as shown in FIG. 3. Illustratively, in the process of fabricating the pixel defining layer, a pixel defining material layer and a photoresist layer may be sequentially formed on the base substrate 011 first. Thereafter, a patterning process (including exposure and development) is performed on the photoresist layer to convert the photoresist layer into a photoresist pattern having hollow(s). Finally, the pixel defining material layer is etched by the hollow in the photoresist pattern to obtain a pixel defining layer including a plurality of pixel defining structures 010. In the process of patterning the photoresist layer, when the light intensity for exposing the photoresist layer is weak, the cross section of the surface where the pixel defining structure 010 is perpendicular to the base substrate 011 is an "inversely-placed" trapezoid. After the organic layer light-emitting layer 012 is formed, an electrode 013 (for example, the electrode may be a cathode) may be formed on the base substrate where the organic light-emitting layer 012 and the pixel defining structure 010 are formed. At this time, the lower bottom surface and the side surface of the pixel defining structure 010 that is in the shape of "inversely-placed" trapezoid form an acute angle (the lower bottom surface is in contact with the electrode), leading the pixel defining structure 010 close to the electrode forms a tip. The tip may easily damage the electrode 013 and cause the electrode 013 to have a fault during the manufacturing process or during use, thereby causing the electrode 013 to have a defect of disconnection, which directly affects the display performance of the self-luminous display panel.

When the side surface of the pixel defining structure provided by the embodiment of the present discourse is convex, the side surface will not form a tip with either the first bottom surface or the second bottom surface. Assuming that the electrode 013 in FIG. 3 is disposed on the first bottom surface, since the side surface and the first bottom surface do not form a tip, damage to the electrode 013 is avoided. Therefore, it is possible to reduce the occurrences of faults during the fabrication or use of the electrode 013, thereby reducing the disconnection defects of the electrode.

Further, no matter the side surface of the pixel defining structure is convex or concave, the side surface of the pixel defining structure can be a cambered surface, for example, the cambered surface is an arc surface (the situation as shown in FIG. 2). Of course, the side surface of the pixel defining structure can also be of other shapes. When the side surface of the pixel defining structure is a cambered surface, since the slope of the cambered surface may change smoothly, it can further reduce the influence caused by the edge of the cambered surface on the electrode formed thereon.

Please refer to FIG. 2, since the side surface C is connected to the first bottom surface A and the second bottom surface B, and is convex with respect to the edge of the first bottom surface A and the edge of the second bottom surface B, the side surface C may have two kinds of slopes with respect to the abscissa axis: a positive slope and a negative slope. The abscissa axis is parallel to the setting surface of the pixel defining layer. Please refer to FIG. 4, assuming that the direction of the abscissa axis is the direction from left to right in FIG. 4, the upper side area k1 of the side surface at the left of the pixel defining structure in FIG. 4 has a positive slope, and the lower side area k2 has a negative slope; the upper side area k3 of the side surface at the right of the pixel defining structure has a negative slope, and the lower side area k4 has a positive slope.

Figure 4:
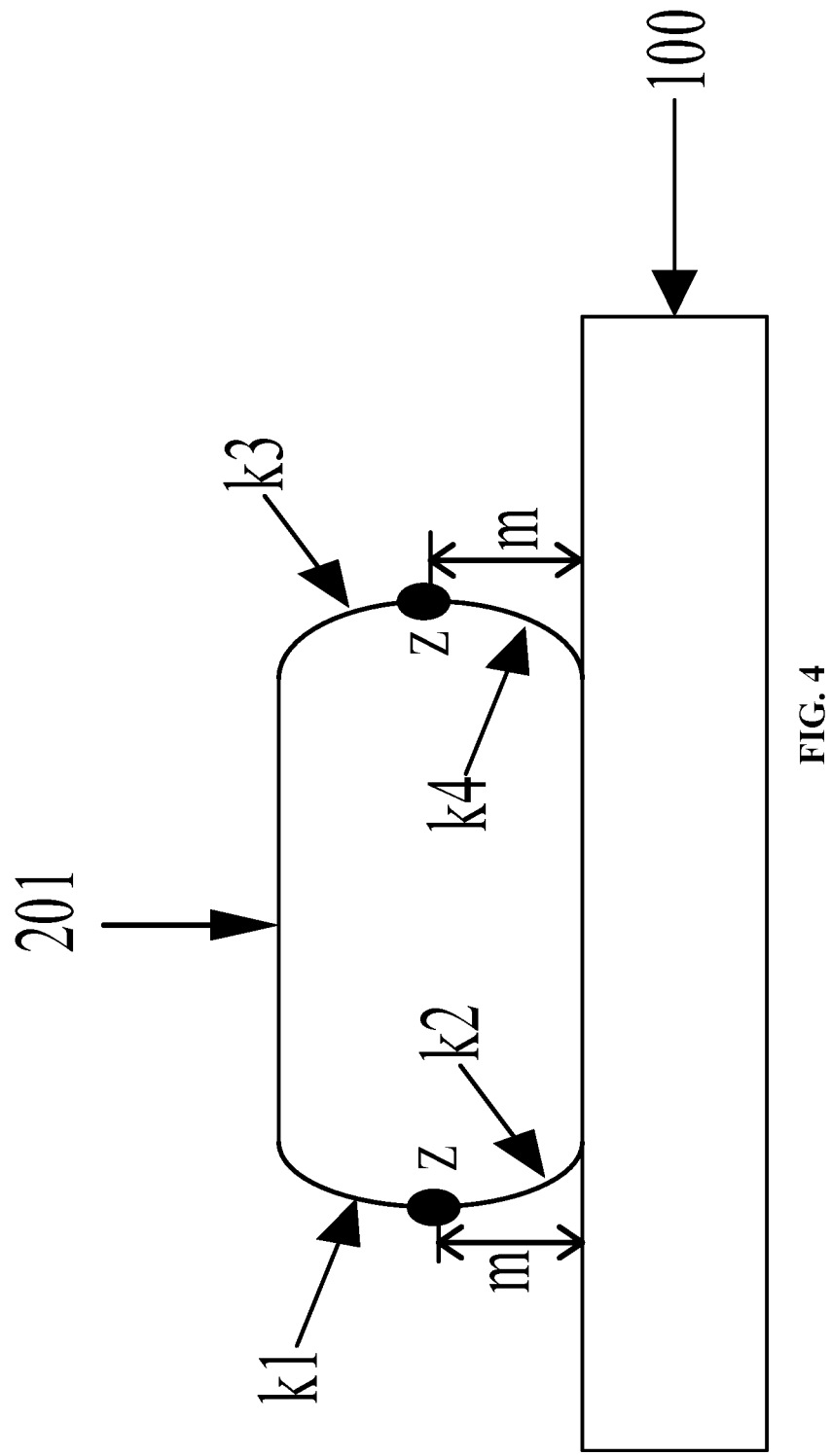
FIG. 4 is a schematic diagram of a pixel defining structure according to an embodiment of the present disclosure.

Alternatively, the distance m between a transition point at which the slope of the side surface of the pixel defining structure changes from a positive slope to a negative slope (the slope is zero) and the setting surface ranges from 0.3 micron to 0.6 micron, and the setting surface may be a surface of the base substrate 100 close to the pixel defining structure 201. Setting the distance m within this range can effectively control the climbing of the solution in which the organic light-emitting material is dissolved on the side surface of the pixel defining structure, and effectively reduce the impact of forming electrodes thereon caused by the edge of the side surface. The setting surface is a setting surface of the pixel defining layer in the base substrate. In FIG. 4, it is an upper surface of the base substrate 100.

It should be noted that, in order to ensure the flatness of the organic light-emitting layer within each sub-pixel region and the display performance of the self-luminous display panel, for each pixel defining structure, the distance from the transition point z of the side surface C at the left of the pixel defining structure to the base substrate 100 may be equal to the distance from the transition point z of the side surface C at the right of the pixel defining structure to the base substrate 100. Of course, in actual implementation of the embodiment of the present disclosure, the distance between the transition point of the side surface C and the base substrate may satisfy a specified error range, which is not limited in the embodiment of the present disclosure.

Figure 5:
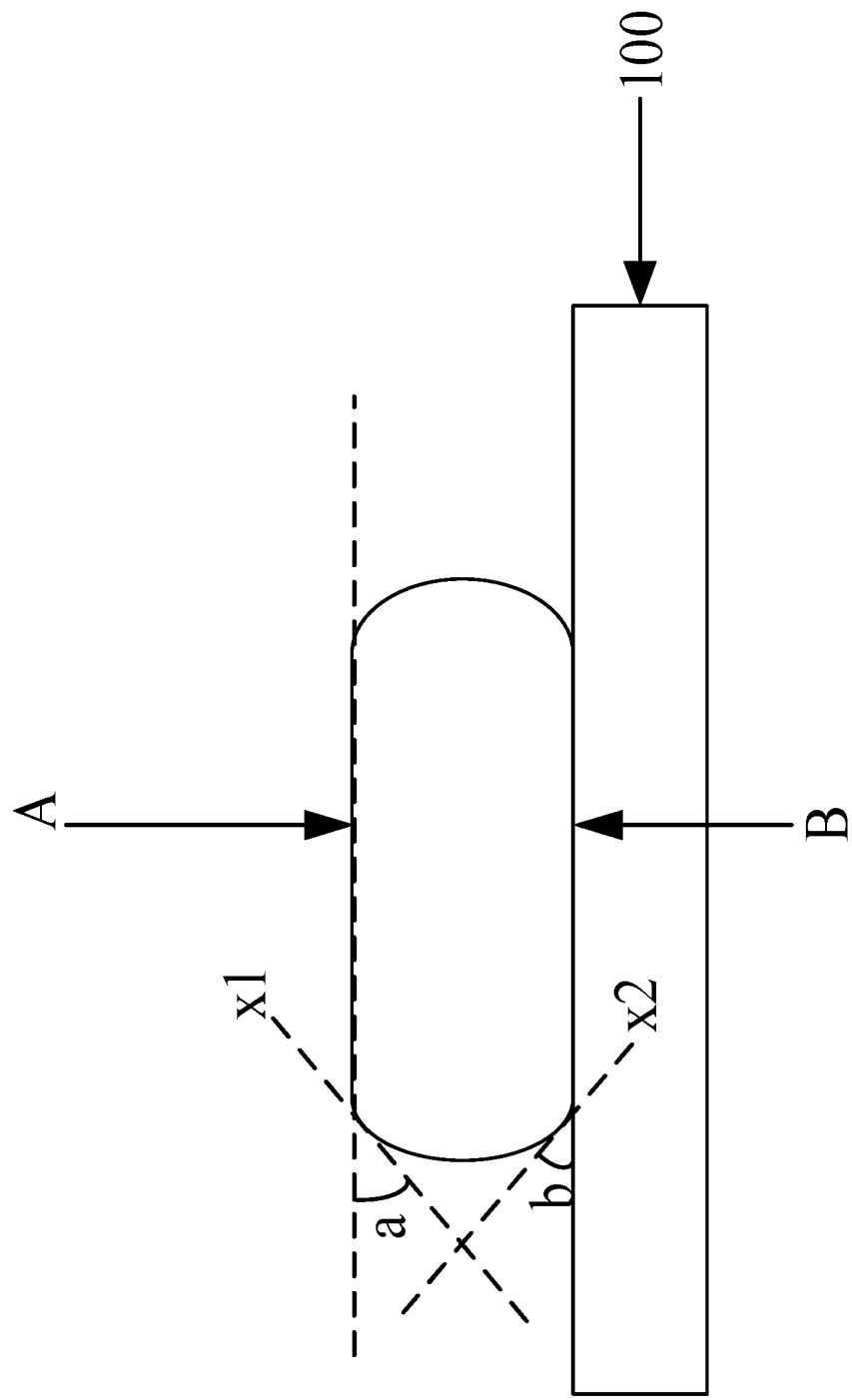
FIG. 5 is a schematic diagram of another pixel defining structure according to an embodiment of the present disclosure.

Please refer to FIG. 5, a side surface of the pixel-defining structure has a target cut surface x1, and the target cut surface x1 is a cut surface of the side surface at the boundary with the first bottom surface A. There is an inclination angle a between the target cut surface x1 and the first bottom surface A. In order to effectively control the climbing of the solution in which the organic light-emitting material is dissolved on the side surface, alternatively, the value of the inclination angle a may range from 30 degrees to 60 degrees.

Correspondingly, the side surface of the pixel defining structure also has an auxiliary cut surface x2. The auxiliary cut surface x2 is a cut surface of the side surface at the boundary with the second bottom surface B. There is an inclination angle b between the auxiliary cut surface x2 and the second bottom surface B. If the inclination angle b is too small, when the solution in which the organic light-emitting material is dissolved is sprayed into the sub-pixel region, the solution can hardly spread in the sub-pixel region completely, which may easily affect the evenness of the luminance of the self-luminous display panel. Therefore, in order to ensure evenness of the luminance of the self-luminous display panel, the inclination angle b between the auxiliary cut surface x2 and the second bottom surface B may be larger than the inclination angle a between the target cut surface x1 and the first bottom surface A.

Optionally, the first bottom surfaces of all the pixel defining structures in the pixel defining layer are coplanar, and the second bottom faces of all the pixel defining structures are coplanar, and the first bottom surface and the second bottom surface may be both parallel to the setting surface of the pixel defining layer. In this way, the thicknesses of all the pixel defining structures in the pixel defining layer are the same, which can ensure the flatness of the entire pixel defining layer, and further ensure the flatness of the solution in each sub-pixel region and the display performance of the self-luminous display panel.

In an embodiment of the present disclosure, different pixel defining layers may be formed according to different materials of the pixel defining structure. The embodiment of the present disclosure provides two kinds of pixel defining layers.

Figure 6:
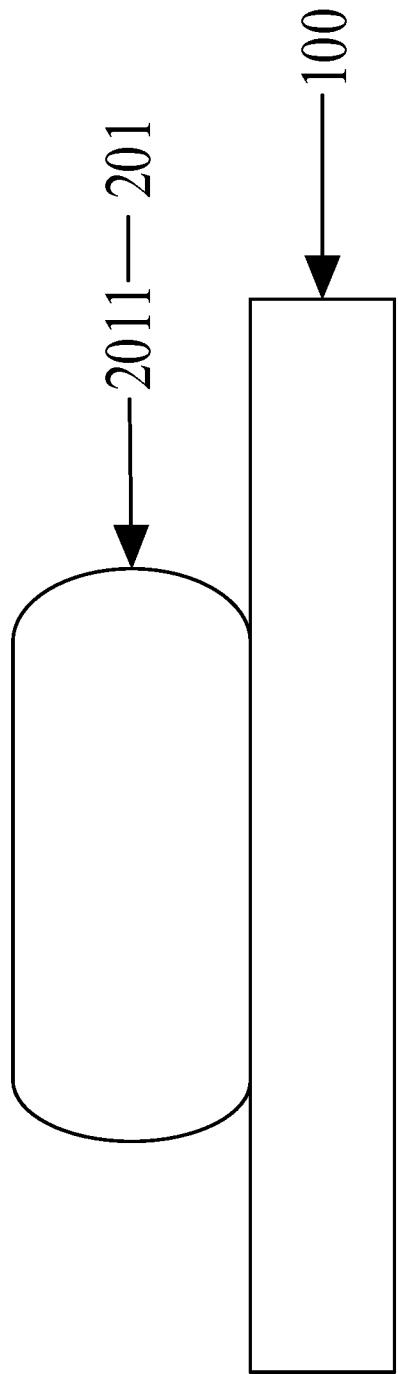
FIG. 6 is a schematic diagram of another pixel defining structure according to an embodiment of the present disclosure.

In the first pixel defining layer as shown in FIG. 6, the pixel defining structure 201 may include a lyophobic material layer 2011. At this time, each pixel defining structure 201 is made of a lyophobic material. The lyophobic material is a material that repels liquid (such as a solution in which an organic light emitting material is dissolved), such as a negative photoresist, a fluorinated polymethyl methacrylate, a fluorinated polyimide, or an organic silicon resin.

Figure 7:
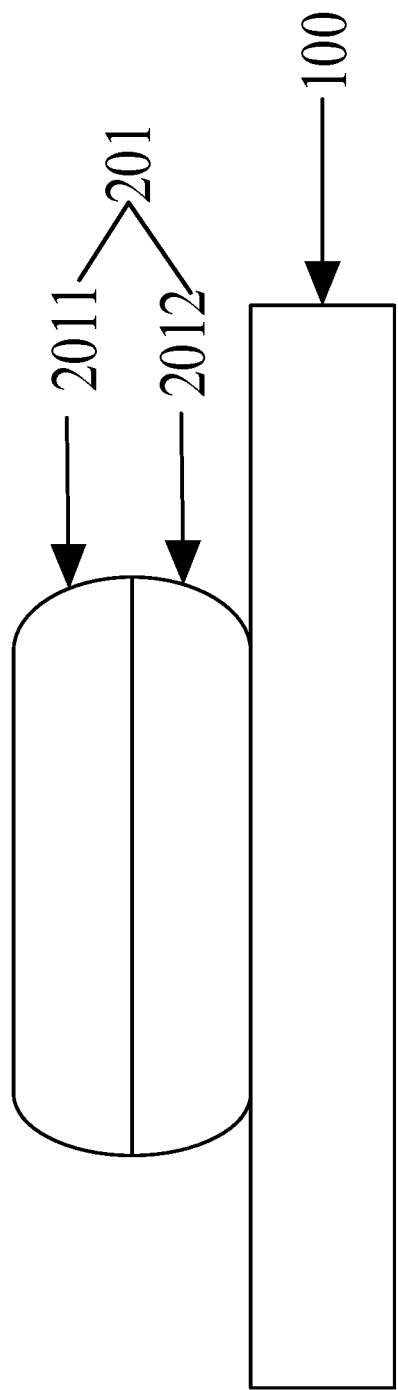
FIG. 7 is a schematic diagram of another pixel defining structure according to an embodiment of the present disclosure.

In the second pixel defining layer as shown in FIG. 7, the pixel defining structure 201 includes a lyophobic material layer 2011 and a lyophilic material layer 2012, and the lyophilic material layer 2012 is located between a setting surface of the pixel defining layer 200 and the lyophobic material layer 2011. Since the lyophilic material is a material that attracts liquid (such as a solution in which an organic light-emitting material is dissolved), the lyophilic material layer is disposed close to the base substrate, so that the solution may spread along the base substrate more easily when the solution in which the organic light-emitting material is dissolved is sprayed in the sub-pixel region. This effectively avoids occurrence of the situation that the solution can hardly spread in the sub-pixel region completely. Alternatively, the lyophilic material may include: polymethyl methacrylate, polymethacrylic acid, polyimide, polyamide, or epoxy resin.

Optionally, for the pixel defining structures in the first pixel-defining layer and the second pixel-defining layer, the distance between the first bottom surface and the second bottom surface ranges from 0.5 micron to 3 microns. Optionally, in the second pixel defining layer, the thickness of the lyophilic material layer may be 0.3 micron, and at this time the thickness of the lyophobic material layer may range from 0.2 microns to 2.7 microns.

In summary, as to the pixel defining layer provided by the embodiment of the present disclosure, since the side surface of the pixel defining structure included in the pixel defining layer is non-planar, the structure between the side surface and the bottom surface close to the base substrate constitutes a capillary structure; during the inkjet printing process, the solution in which the organic light emitting material is dissolved can spread more evenly under the attraction of the capillary structure. Comparing to the existing technology, this effectively reduces the climbing degree of the solution on the pixel defining layer, thereby effectively improves the evenness of film formation of the solution within the pixel region, and improves the display performance of the self-luminous display panel.

FIG. 8 shows a method for manufacturing a pixel defining layer according to an embodiment of the present disclosure, and the method may be used to fabricate the pixel defining layer provided in the embodiment of the present disclosure. As shown in FIG. 8, the method may include:

Step 601: forming a pixel defining layer on a base substrate. The pixel defining layer includes a plurality of pixel defining structures, wherein the pixel defining structure has a first bottom surface and a second bottom surface opposite each other, and a side surface between the first bottom surface and the second bottom surface. The side surface is non-planar.

In summary, in the pixel-defining layer manufactured by the manufacturing method provided in the embodiment of the present disclosure, since the side surface of the pixel-defining structure included in the pixel-defining layer is non-planar, the structure between the side surface and the bottom surface close to the base substrate constitutes a capillary structure. During the inkjet printing process, the solution in which the organic light emitting material is dissolved can spread more evenly under the attraction of the capillary structure. Comparing to the existing technology, this effectively reduces the climbing degree of the solution on the pixel defining layer, thereby effectively improves the evenness of film formation of the solution within the pixel region, and improves the display performance of the self-luminous display panel.

Figure 9:
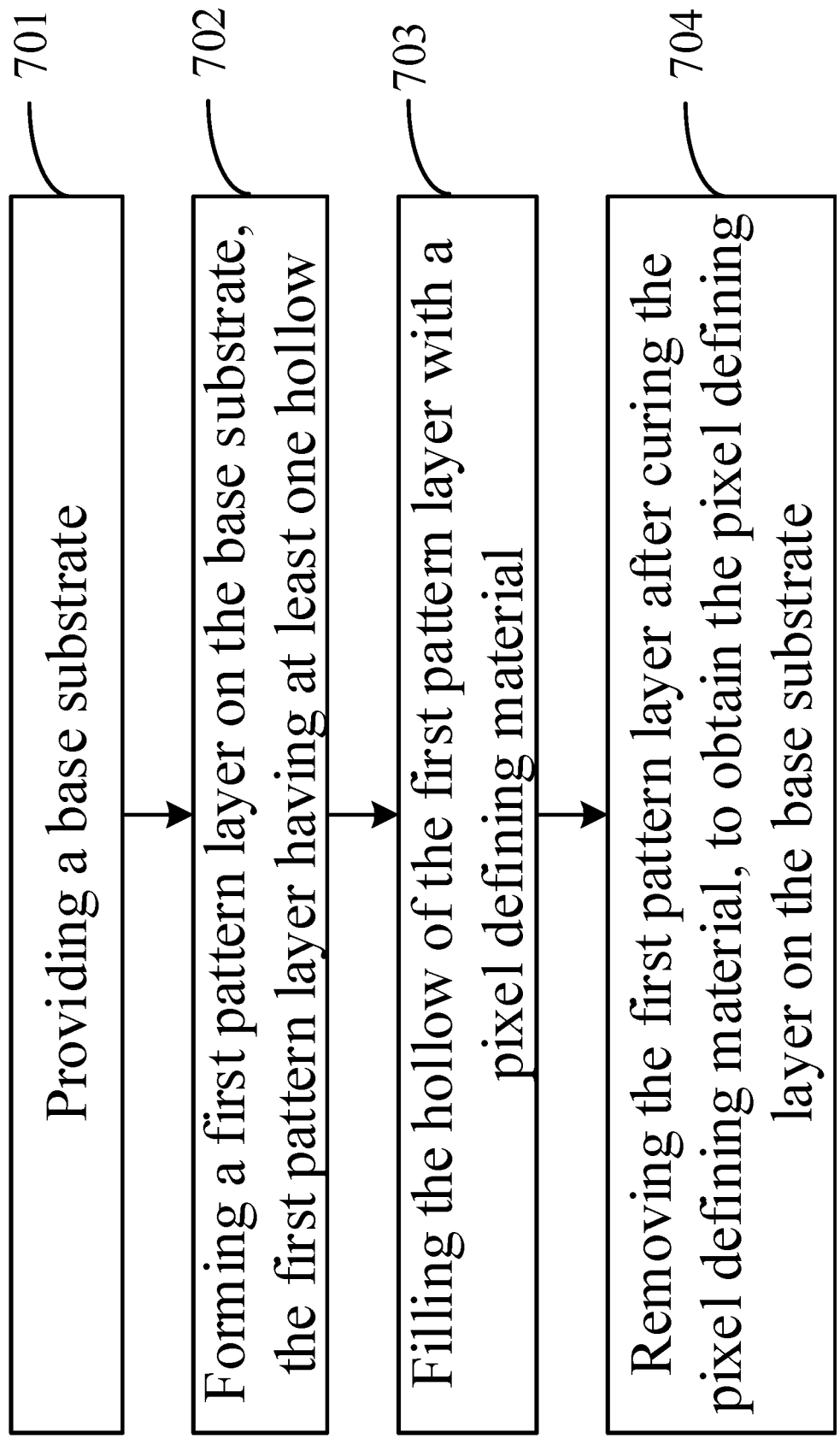
FIG. 9 is a flowchart of a method for manufacturing another pixel defining layer according to an embodiment of the present disclosure.

FIG. 9 shows a method for manufacturing another pixel defining layer according to an embodiment of the present disclosure, and the method can be used to fabricate the pixel defining layer shown in FIG. 2. As shown in FIG. 9, the method may include:

Step 701: providing a base substrate.

The base substrate may be a transparent base substrate, for example, a base substrate made of light-conductive and non-metal materials, such as glass, quartz, or a transparent resin having certain hardness.

Step 702: forming a first pattern layer on the base substrate, the first pattern layer having at least one hollow.

The step of forming the first pattern layer having at least one hollow on the base substrate includes:

Step A1: forming a first pattern material layer on the base substrate.

Figure 10:
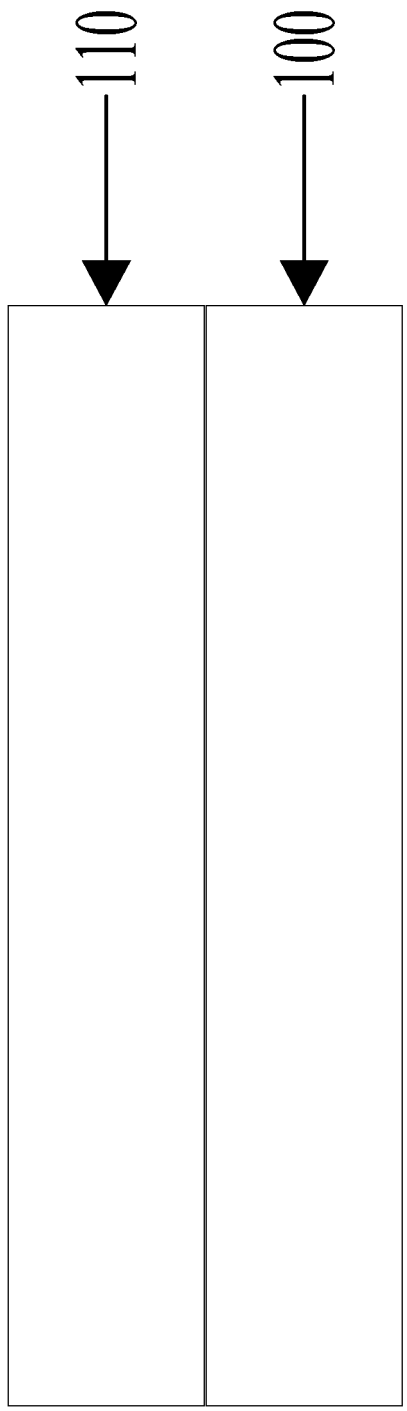
FIG. 10 is a schematic diagram of forming a metal layer on a base substrate according to an embodiment of the present disclosure.

As shown in FIG. 10, a first pattern material layer 110 may be formed on the base substrate 100 by means of depositing, coating, or sputtering. The material of the first pattern material layer 110 may include metal (such as copper or aluminum), metal oxides, silicon dioxide, and the like, which is not limited by the embodiment of the present disclosure.

Step A2: forming a photoresist layer on the first pattern material layer.

Figure 11:
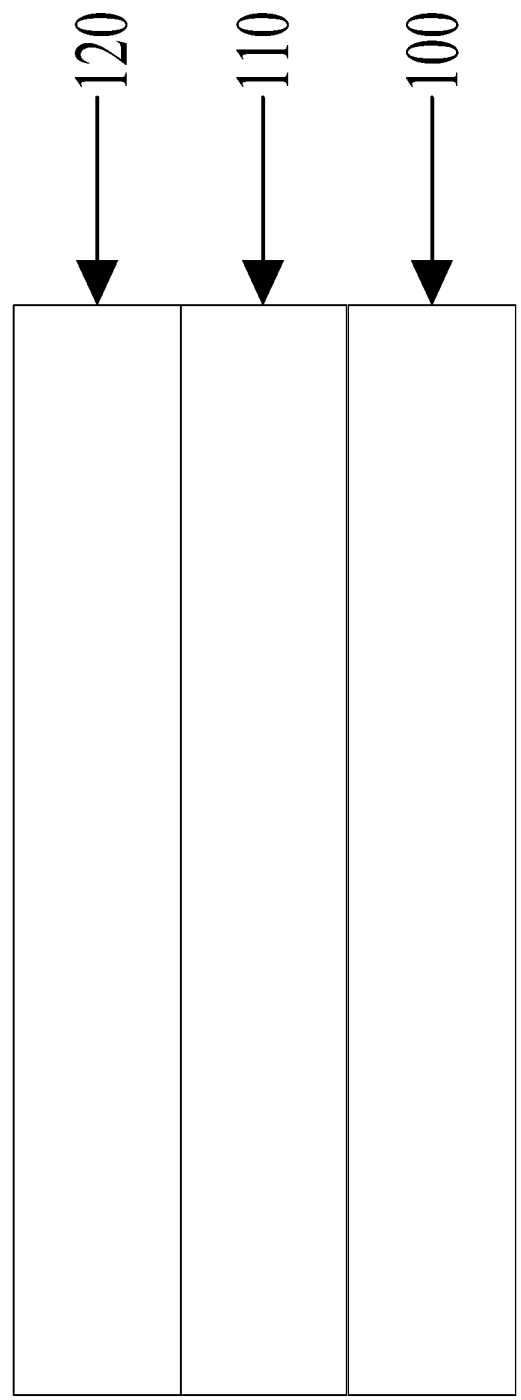
FIG. 11 is a schematic diagram of forming a photoresist layer on the metal layer shown in FIG. 10 according to an embodiment of the present disclosure.

As shown in FIG. 11, a photoresist layer 120 may be formed on the first pattern material layer 110 by means of coating.

Step A3: exposing and developing the photoresist layer to obtain a photoresist pattern.

Figure 12:
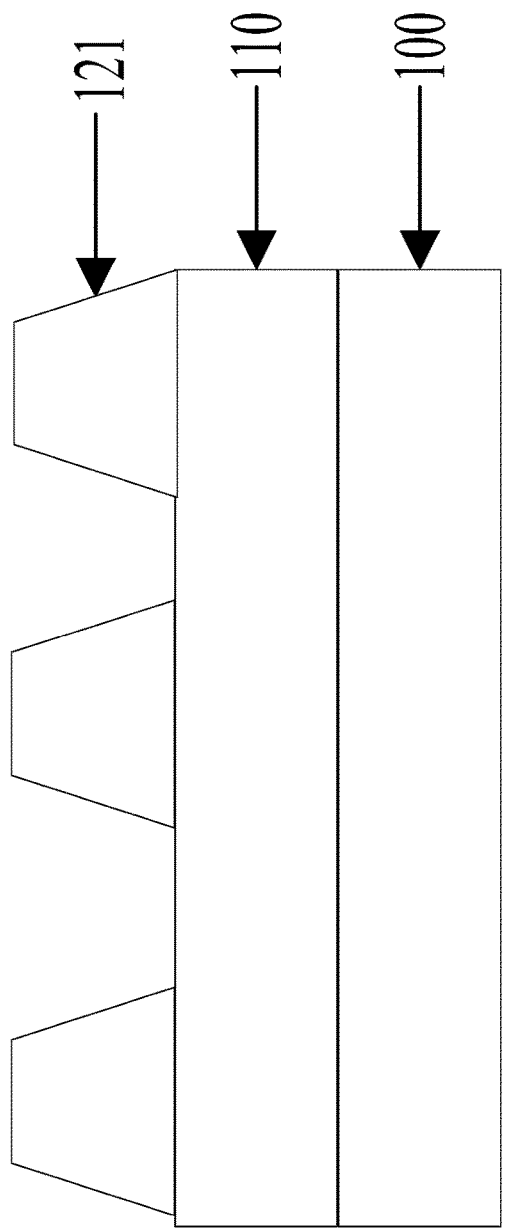
FIG. 12 is a schematic diagram of forming a photoresist pattern on the photoresist layer shown in FIG. 11 according to an embodiment of the present disclosure.

As shown in FIG. 12, by exposing and developing the photoresist layer 120, a photoresist pattern 121 is obtained.

Step A4: etching, by a wet etching process, the first pattern material layer formed with the photoresist pattern.

Figure 13:
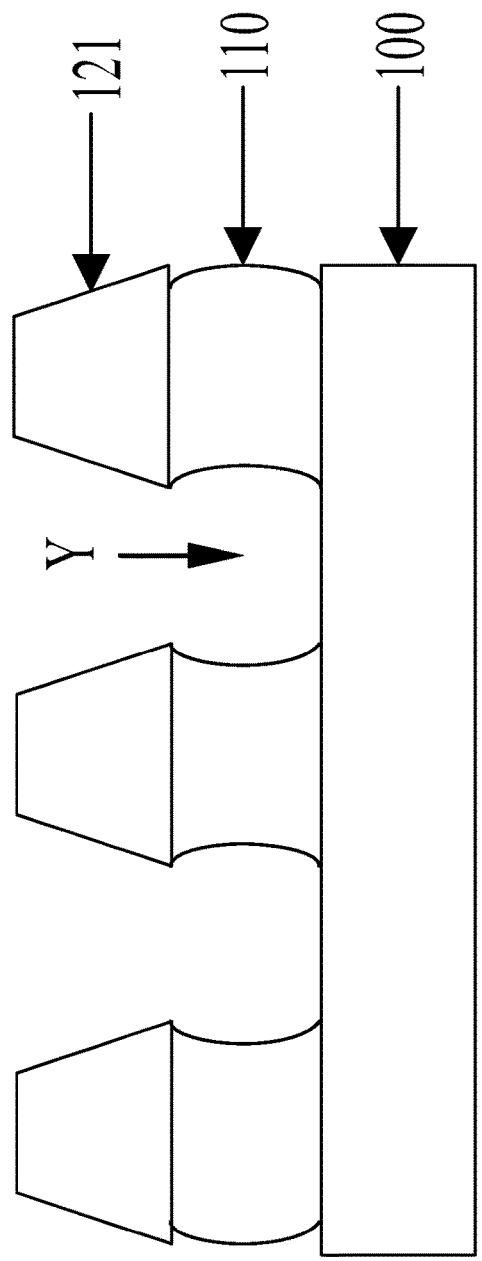
FIG. 13 is a schematic diagram of etching a metal layer formed with a photoresist pattern shown in FIG. 12 according to an embodiment of the present disclosure.

As shown in FIG. 13, after the first pattern material layer formed with the photoresist pattern is etched, the hollow Y shown in FIG. 13 is formed on the first pattern material layer 110. In actual Implementation of the embodiment of the present disclosure, the first pattern material layer may be wet-etched by an acid (such as hydrochloric acid, acetic acid, or nitric acid, etc.), so that a hollow with a concave side surface may be formed on the first pattern material layer. In the first pattern material layer, the area contacting the photoresist pattern and the area contacting the base substrate can hardly be etched, and the areas far from the photoresist pattern and the base substrate can easily be etched. The hollow obtained in this way has a concave side surface.

In actual implementation of the embodiment of the present disclosure, the protrusion degree of the side surface of at least one hollow can be controlled by adjusting the process parameters of the wet-etching process. The process parameters may include parameters such as acid concentration, etching time, and etching temperature. In the case where the etching time is longer, the etching temperature is lower, and the acid concentration is higher, the depression degree of the hollow on the side surface formed by wet etching is more obvious.

Optionally, the material of the first pattern material layer may include aluminum, and the process parameters of the wet etching process may include at least one of the follows: a concentration of hydrochloric acid ranging from 0.1% to 5%, an etching time duration ranging from 20 seconds to 50 seconds, and an etching temperature ranging from 30 degrees to 60 degrees. For example, the material of the first pattern material layer is aluminum, and the process parameters of the wet etching process are adjusted as: the concentration of the hydrochloric acid ranging from 0.1% to 5%, the etching time ranging from 20 seconds to 50 seconds, and the etching temperature ranging from 30 degrees to 60 degrees. At this time, in step A4, the first pattern material layer formed with the photoresist pattern may be etched for 20 seconds to 50 seconds by using hydrochloric acid having a concentration ranging from 0.1% to 5% at a temperature ranging from 30 degrees to 60 degrees.

Step A5: peeling off the photoresist pattern to obtain the first pattern layer.

Figure 14:
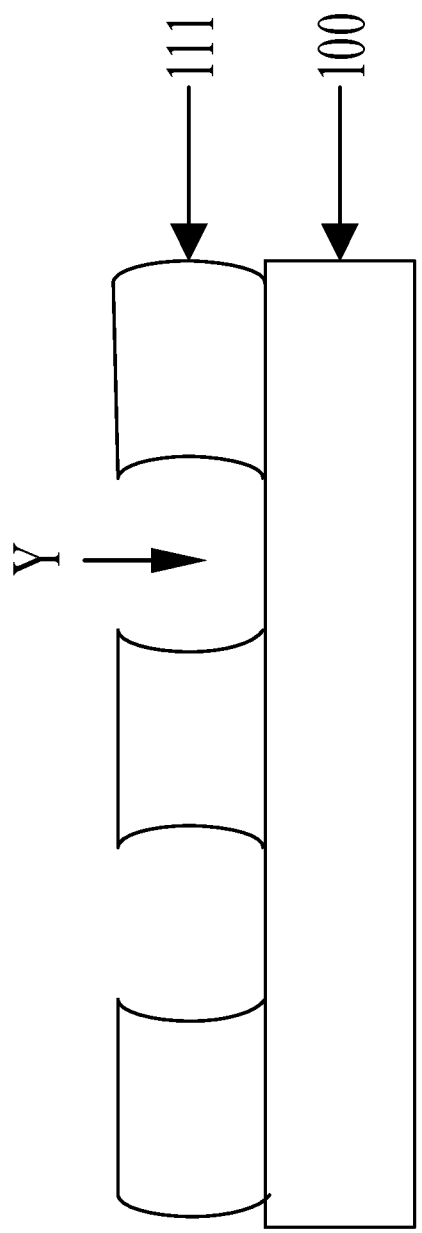
FIG. 14 is a schematic diagram of forming a first pattern layer on a base substrate according to an embodiment of the disclosure.

The first pattern layer 111 obtained after peeling off the photoresist pattern may be as shown in FIG. 14.

Step 703: filling the hollow of the first pattern layer with a pixel defining material.

As described above, the embodiment of the present disclosure provides two kinds of pixel defining layers. Accordingly, the process of filling the hollow of the first pattern layer with a pixel defining material may include the following two ways:

In the first way of filling the hollow of the first pattern layer with a pixel defining material, the pixel defining material is a lyophobic material, therefore the lyophobic material can be directly filled into the hollow of the first pattern layer.

In the second way of filling the hollow of the first pattern layer with a pixel defining material, the pixel defining material includes a lyophobic material and a lyophilic material, and then the step of filling the hollow of the first pattern layer with a pixel defining material may include:

Step B1: filling the hollow of the first pattern layer with a lyophilic material, and curing the lyophilic material to obtain a lyophilic material layer.

Step B2: filling the hollow of the first pattern layer formed with the lyophilic material layer with the lyophobic material, and curing the lyophilic material to obtain a lyophobic material layer.

The lyophilic material attracts liquid (such as a solution in which an organic light-emitting material is dissolved), and the lyophobic material repels liquid (such as a solution in which an organic light-emitting material is dissolved).

Step 704: removing the first pattern layer after curing the pixel defining material, to obtain the pixel defining layer on the base substrate.

Alternatively, after the pixel defining material is cured, the first pattern layer may be removed by a wet etching process.

Figure 15:
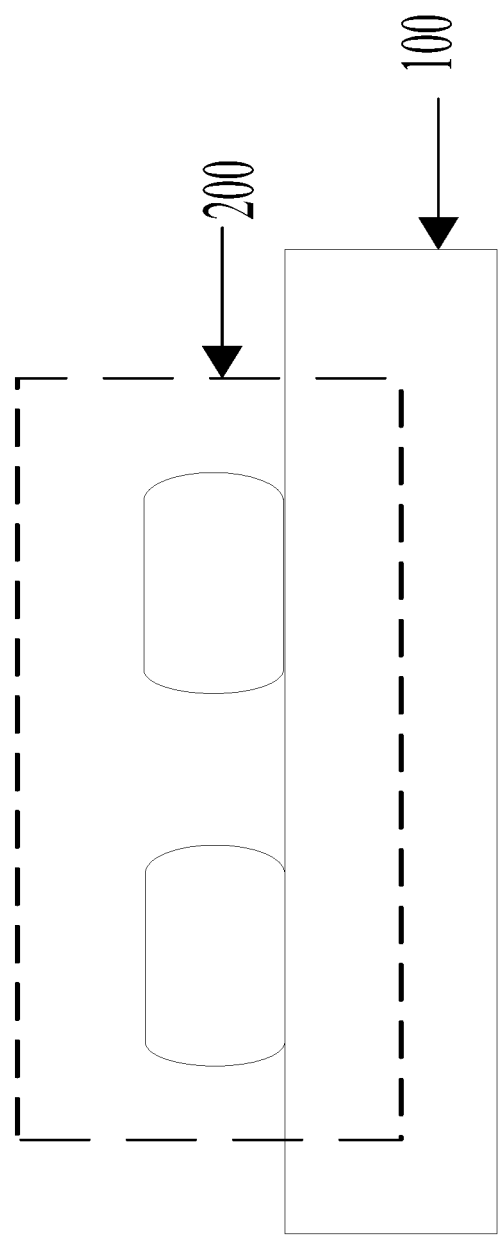
FIG. 15 is a schematic diagram of forming a pixel defining layer on a base substrate according to an embodiment of the present disclosure.

After the pixel-defining material filled in the hollow of the first pattern layer shown in FIG. 14 is cured, the first pattern layer 111 is removed to obtain a pixel-defining layer 200 on the base substrate, as shown in FIG. 15.

In summary, in the pixel defining layer manufactured by the manufacturing method provided in the embodiment of the present disclosure, since the side surface of the pixel defining structure included in the pixel defining layer is non-planar, the structure between the side surface and the bottom surface close to the base substrate constitutes a capillary structure; during the inkjet printing process, the solution in which the organic light emitting material is dissolved can spread more evenly under the attraction of the capillary structure. Comparing to the existing technology, this effectively reduces the climbing degree of the solution on the pixel defining layer, thereby effectively improves the evenness of film formation of the solution within the pixel region, and improves the display performance of the self-luminous display panel.

An embodiment of the present disclosure further provides an array substrate, which may be an array substrate in a self-luminous display panel. The array substrate may include a base substrate and a pixel defining layer disposed on the base substrate. The pixel defining layer is a pixel defining layer provided in the embodiment of the present disclosure (such as the pixel defining layer shown in FIG. 2). The pixel defining layer may be directly manufactured on the base substrate of the array substrate, or may be manufactured on other base substrate first and then transferred to the base substrate of the array substrate through a transfer process.

Figure 16:
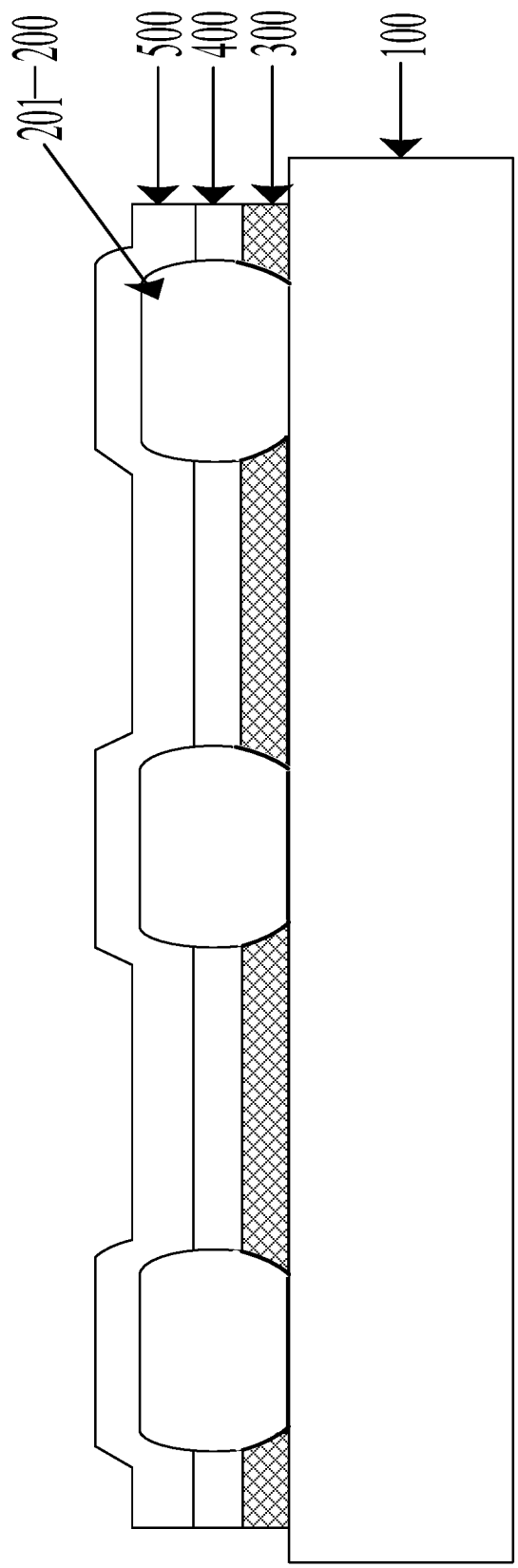
FIG. 16 is a schematic structural diagram of an array substrate according to an embodiment of the present disclosure.

Alternatively, please refer to FIG. 16, the array substrate further includes a first electrode 300 disposed between the base substrate 100 and the pixel defining layer 200, and an organic light emitting layer 400 and a second electrode 500 that are sequentially disposed at a side of the first electrode 300 away from the base substrate 100, wherein the organic light emitting layer 400 is located in a sub-pixel region defined by the pixel defining layer 200. The first electrode 300 and the second electrode 500 are a cathode and an anode, respectively. Alternatively, the organic light emitting layer 400 may include at least one (e.g., only the light emitting layer is included) of a hole injection layer, a hole transport layer, a light emitting layer, a hole blocking layer, an electron blocking layer, an electron transmission layer, and an electron injection layer.

In summary, in the pixel defining layer of the array substrate provided in the embodiment of the present disclosure, since the side surface of the pixel defining structure included in the pixel defining layer is non-planar, the structure between the side surface and the bottom surface close to the base substrate constitutes a capillary structure. During the inkjet printing process, the solution in which the organic light emitting material is dissolved can spread more evenly under the attraction of the capillary structure. Comparing to the existing technology, this effectively reduces the climbing degree of the solution on the pixel defining layer, thereby effectively improves the evenness of film formation of the solution within the pixel region, and improves the display performance of the self-luminous display panel.

An embodiment of the present disclosure further provides a method of manufacturing an array substrate, and the method may include: providing a base substrate; forming a first electrode on the base substrate; forming a pixel defining layer on the base substrate formed with the first electrode; forming an organic light emitting layer on the base substrate formed with the pixel defining layer; forming a second electrode on the base substrate formed with the organic light emitting layer. For the method of manufacturing the pixel defining layer, please refer to the method of manufacturing the pixel defining layer provided in the foregoing steps 701 to 704, which will not be repeated here.

In summary, in the pixel defining layer of the array substrate manufactured by the method provided in the embodiment of the present disclosure, since the side surface of the pixel defining structure included in the pixel defining layer is non-planar, the structure between the side surface and the bottom surface close to the base substrate constitutes a capillary structure. During the inkjet printing process, the solution in which the organic light emitting material is dissolved can spread more evenly under the attraction of the capillary structure. Compared with the existing technology, this effectively reduces the climbing degree of the solution on the pixel defining layer, thereby effectively improves the evenness of film formation of the solution within the pixel region, and improves the display performance of the self-luminous display panel.

Figure 17:
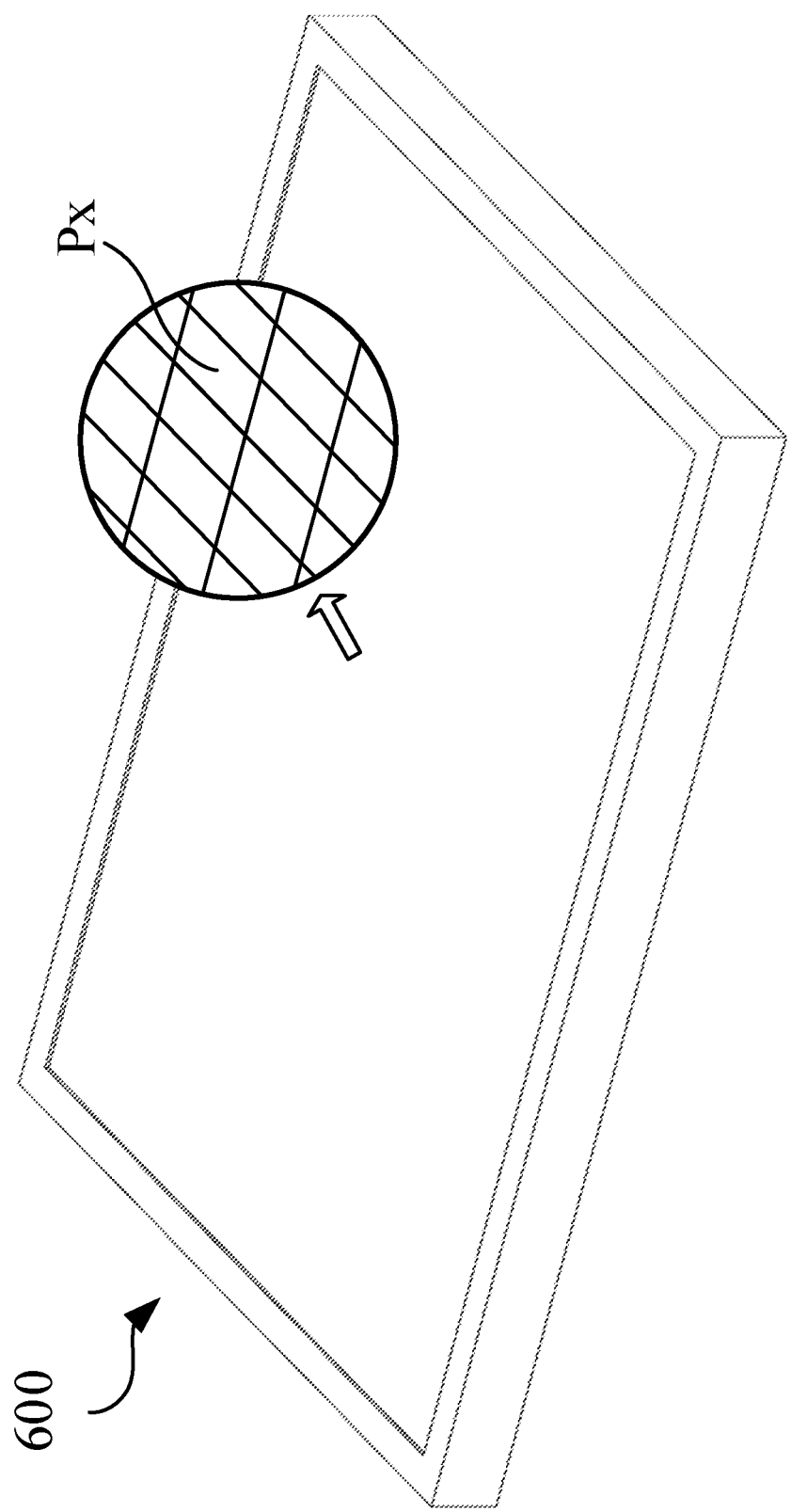
FIG. 17 is a schematic structural diagram of a display device according to an embodiment of the present disclosure.

The embodiment of the present disclosure further provides a display device, which includes the array substrate provided by the above embodiment. The display device may be any product or component having a display function, such as a display panel (e.g., a self-luminous display panel), an electronic paper, a mobile phone, a tablet computer, a television, a display, a laptop, a digital photo frame, a navigating instrument, and the like. For example, the display device is the display device 600 shown in FIG. 17, which includes sub-pixels Px arranged in an array within the display area, and the area where the sub-pixels Px are located may be an area defined by the pixel defining layer.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

The invention claimed is:

1. A pixel defining layer, comprising: a plurality of pixel defining structures arranged in an array,
    the pixel defining structure having a first bottom surface and a second bottom surface opposite each other, and a side surface c, the side surface is a convex surface;
    an first inclination angle is between a target cut surface of the side surface and the first bottom surface, wherein the target cut surface is a cut surface of the side surface at a boundary with the first bottom surface;
    an second inclination angle is between an auxiliary cut surface of the side surface and the second bottom surface, wherein the auxiliary cut surface is a cut surface of the side surface at a boundary with the second bottom surface; and
    the second inclination angle is larger than the first inclination angle.

2. The pixel defining layer of claim 1, wherein slopes of the side surface relative to an abscissa axis comprise a positive slope and a negative slope, the abscissa axis being parallel to a setting surface of the pixel defining layer; the distance between a transition point at which the slope of the side surface changes from a positive slope to a negative slope and the setting surface ranges from 0.3 micron to 0.6 micron.

3. The pixel defining layer of claim 1, wherein the first inclination angle ranges from 30 degrees to 60 degrees.

4. The pixel defining layer of claim 1, wherein the pixel defining structure comprises a lyophobic material layer repelling liquid.

5. The pixel defining layer of claim 4, wherein the pixel defining structure further comprises: a lyophilic material layer between a setting surface of the pixel defining layer and the lyophobic material layer, the lyophilic material layer attracting liquid.

6. The pixel defining layer of claim 5, wherein the lyophilic material layer has a thickness of 0.3 micron.

7. The pixel defining layer of claim 1, wherein the distance between the first bottom surface and the second bottom surface ranges from 0.5 micron to 3 microns.

8. The pixel defining layer of claim 2, wherein the first inclination angle ranges from 30 degrees to 60 degrees, and the distance between the first bottom surface and the second bottom surface ranges from 0.5 micron to 3 microns;
the pixel defining structure satisfies any one of the following conditions:
the pixel defining structure comprises a lyophobic material layer;
the pixel defining structure comprises: a lyophilic material layer and a lyophobic material layer, and the lyophilic material layer is located between the setting surface of the pixel defining layer and the lyophobic material layer;
wherein the lyophilic material layer attracts liquid, and the lyophobic material layer repels liquid; the lyophilic material layer has a thickness of 0.3 micron.

9. The pixel defining layer of claim 5, wherein the distance between the first bottom surface and the second bottom surface ranges from 0.5 micron to 3 microns, the thickness of the lyophilic material layer is 0.3 micron, and the thickness of the lyophobic material layer ranges from 0.2 microns to 2.7 microns.

10. A method of manufacturing a pixel defining layer, comprising:
forming a pixel defining layer on a base substrate, the pixel defining layer comprising a plurality of pixel defining structures arranged in an array;
wherein the pixel defining structure has a first bottom surface and a second bottom surface opposite each other, and a side surface located between the first bottom surface and the second bottom surface, the side surface being is a convex surface:
an first inclination angle is between a target cut surface of the side surface and the first bottom surface, wherein the target cut surface is a cut surface of the side surface at a boundary with the first bottom surface;
an second inclination angle is between an auxiliary cut surface of the side surface and the second bottom surface, wherein the auxiliary cut surface is a cut surface of the side surface at a boundary with the second bottom surface; and
the second inclination angle is larger than the first inclination angle.

11. The method of claim 10, wherein forming a pixel defining layer on a base substrate comprises:
forming a first pattern layer on the base substrate; the first pattern layer having at least one hollow;
filling the hollow of the first pattern layer with a pixel defining material;
removing the first pattern layer after curing the pixel defining material, to obtain the pixel defining layer on the base substrate.

12. The method of claim 11, wherein forming a first pattern layer on the base substrate comprises:
forming a first pattern material layer on the base substrate;
forming a photoresist layer on the first pattern material layer;
exposing and developing the photoresist layer to obtain a photoresist pattern;
etching, by a wet etching process, the first pattern material layer formed with the photoresist pattern;
peeling off the photoresist pattern to obtain the first pattern layer.

13. The method of claim 12, wherein the first pattern material layer comprises a metal layer.

14. The method of claim 13, wherein the material of the metal layer comprises aluminum, and etching, by a wet etching process, the first pattern material layer formed with the photoresist pattern, comprises:
etching the first pattern material layer formed with the photoresist pattern for 20 seconds to 50 seconds by using hydrochloric acid having a concentration ranging from 0.1% to 5% at a temperature ranging from 30 degrees to 60 degrees.

15. The method of claim 11, wherein the pixel defining material comprises a lyophobic, material repelling liquid.

16. The method of claim 11, wherein the pixel defining material comprises a lyophobic material and a lyophilic material, and filling the hollow of the first pattern layer with a pixel defining material comprises:
filling the hollow of the first pattern layer with a lyophilic material, and curing the lyophilic material to obtain a lyophilic material layer; and
filling the hollow of the first pattern layer formed with the lyophilic material layer with the lyophobic material, and curing the lyophobic material to obtain a lyophobic material layer;
the lyophilic material attracting liquid, and the lyophobic material repelling liquid.

17. The method of claim 14, wherein the pixel defining material satisfies any one of the following conditions:
the pixel defining material comprises a lyophobic material;
the pixel defining material comprises a lyophobic material and a lyophilic material, and filling the hollow of the first pattern layer with the pixel defining material comprising: filling the hollow of the first pattern layer with a lyophilic material, and curing the lyophilic material to obtain a lyophilic material layer; filling the hollow of the first pattern layer formed with the lyophilic material layer with the lyophobic material, and curing the lyophobic material to obtain a lyophobic material layer;
wherein the lyophilic material attracts liquid, and the lyophobic material repels liquid.

18. An array substrate, wherein a pixel defining layer in the array substrate comprises: a plurality of pixel defining structures arranged in an array;
the pixel defining structure has a first bottom surface and a second bottom surface opposite each other, and a side surface located between the first bottom surface and the second bottom surface, the side surface is a convex surface;
an first inclination angle is between a target cut surface of the side surface and the first bottom surface, wherein the target cut surface is a cut surface of the side surface at a boundary with the first bottom surface;
an second inclination angle is between an auxiliary cut surface of the side surface and the second bottom surface, wherein the auxiliary cut surface is a cut surface of the side surface at a boundary with the second bottom surface; and
the second inclination angle is larger than the first inclination angle.

19. A display device, comprising the array substrate of claim 17.

* * * * *